US008624634B1

(12) United States Patent
Luzzi et al.

(10) Patent No.: US 8,624,634 B1
(45) Date of Patent: Jan. 7, 2014

(54) METHODS FOR GENERATING A SIGNAL AND A SIGNAL GENERATION CIRCUIT

(75) Inventors: Raimondo Luzzi, Graz (AT); Marco Bucci, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/551,650

(22) Filed: Jul. 18, 2012

(51) Int. Cl.
*G11C 27/02* (2006.01)
*H03K 5/00* (2006.01)
*H03K 17/00* (2006.01)

(52) U.S. Cl.
USPC ............................ 327/94; 327/97; 327/124

(58) Field of Classification Search
USPC .............................................. 327/94, 97, 124
See application file for complete search history.

(56) References Cited

U.S. PATENT DOCUMENTS

2003/0098724 A1* 5/2003 Nishizono ...................... 327/94
2011/0135027 A1* 6/2011 Saraswat et al. .............. 375/285

OTHER PUBLICATIONS

S. Mandal and S. Banerjee, "An Integrated CMOS Chaos Generator", Proc. National Conference on Nonlinear Systems & Dynamics (NCNSD-2003), IIT Kharagpur, Dec. 28-30, 2003, pp. 313-317.
S. Mandal and S. Banerjee, "Analysis and CMOS implementation of a chaos-based communication system", IEEE Transactions on Circuits & Systems I, vol. 51, No. 9, Sep. 2004, pp. 1708-1722.

* cited by examiner

*Primary Examiner* — John Poos

(57) ABSTRACT

A method for generating a signal is provided, the method including: providing a first signal having a first signal frequency; providing a second signal having a second signal frequency or a third signal frequency, wherein the second signal frequency is higher than the third signal frequency; switching the second signal having the second signal frequency to the third signal frequency based on a predefined first signal event of the first signal; and returning the second signal having the third signal frequency to the second signal frequency in response to a predefined second signal event.

23 Claims, 13 Drawing Sheets

FIG 8  ~ 800 providing a first signal having a first signal frequency;  ~ 810 providing a second signal having a second signal frequency or a third signal frequency, wherein the second signal frequency is higher than the third signal frequency;  ~ 820 switching the second signal having the second signal frequency to the third signal frequency based on a predefined first signal event of the first signal; and  ~ 830 returning the second signal having the third signal frequency to the second signal frequency in response to a predefined second signal event.  ~ 840

FIG 12

1200 providing, by a first signal generator, a first signal having a first signal frequency; — 1210 providing, by a second signal generator, a second signal having a second signal frequency or a third signal frequency, wherein the second signal frequency is higher than the third signal frequency; — 1220 providing, by a switching circuit, an output signal based on a predefined first signal event of the first signal and a predefined second signal event, for switching the second signal having the second signal frequency to the third signal frequency based on the predefined first signal event and for returning the second signal having the third signal frequency to the second signal frequency based on the predefined second signal event. — 1230

METHODS FOR GENERATING A SIGNAL AND A SIGNAL GENERATION CIRCUIT

TECHNICAL FIELD

Various embodiments relate generally to methods for generating a signal and a signal generation circuit.

BACKGROUND

Several chaos-based random bit generators have been proposed. Until now, systems, have theoretically been produced, which generate perfect random bit streams. However, the practical implementation is usually critical since often several constraints must be verified, e.g. over process variations, power supply, temperature, in order to keep the circuit in a chaotic evolution. Many problems are associated with designing a robust random bit generators based on a chaotic system, and many challenges stand in the way of producing a chaotic system which has none or minimal constraints to keep the system in a chaotic regime.

SUMMARY

Various embodiments provide a method for generating a signal, the method including: providing a first signal having a first signal frequency; providing a second signal having a second signal frequency or a third signal frequency, wherein the second signal frequency is higher than the third signal frequency; switching the second signal having the second signal frequency to the third signal frequency based on a predefined first signal event of the first signal; and returning the second signal having the third signal frequency to the second signal frequency in response to a predefined second signal event.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 8 shows a method for generating a signal according to an embodiment;

FIG. 12 shows a method for generating a signal according to an embodiment.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
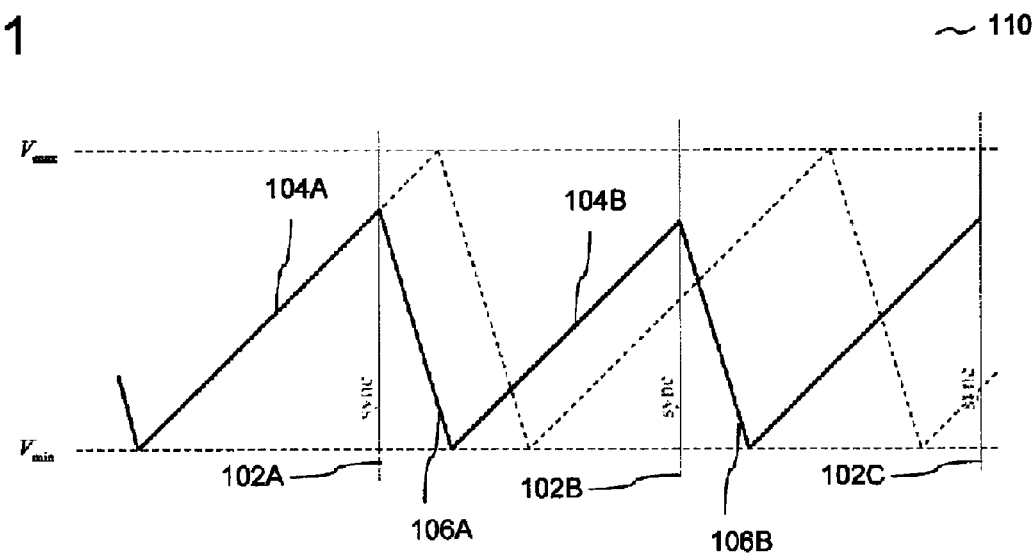
FIG. 1 shows a synchronized signal of a saw-tooth oscillator.

FIG. 1 shows a synchronous frame/line sweep signal 110 of a synchronized saw-tooth oscillator. The synchronized saw-tooth oscillator may be used to generate synchronous frame/line sweep signals, e.g. as signals used in analog TV.

Every time a synchronization edge 102, e.g. 102A, 102B, 102C, arrives during the rising edge 104, e.g. 104A, 104B, 104C of the signal, the signal slope and direction change, e.g. to falling edge 106, e.g. 106A, 106B, 106C. If the synchronization signal, e.g. the synchronization edge 102, forces a slope change, the change in slope may be referred to as a synchronization event 102. As slope 106 after the synchronization trigger 102 is steeper, i.e. it falls faster, than the slope 104 before it, the oscillator gets synchronized.

Figure 2:
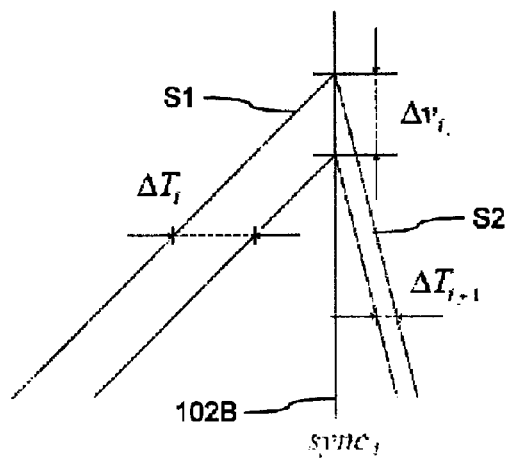
FIG. 2 shows a synchronization condition.

FIG. 2 shows a synchronization condition 210. As shown in FIG. 2, if $\Delta T_i$ is the delay between two rising edges, the delay after the synchronization event, e.g. after 102B, will be:

$$\Delta T_{i+1} = \Delta T_i S1/S2$$

S1 may be the slope before synchronization event, e.g. 102B. S2 may be the slope after synchronization event 102B. S1 may be less than S2.

After n synchs, it results that: $\Delta T_{i+n} = \Delta T_i k^n$ where $k = |S1|/|S2|$ may be less than 1 (as gradient S1 may be less than S2). Therefore the relative delay tends to zero which means the oscillator may become synchronized, independently from its starting phase.

Vice versa, if k is greater than 1, in other words if the gradient S1 is greater than gradient of S2, the initial phase difference may be exponentially amplified and the oscillator may become chaotic. It may be understood that the synchronization condition may depend on the ratio of the absolute value of the slopes and it may not be necessary that the synchronization event changes the sign, i.e. direction, of the slope.

Figure 3:
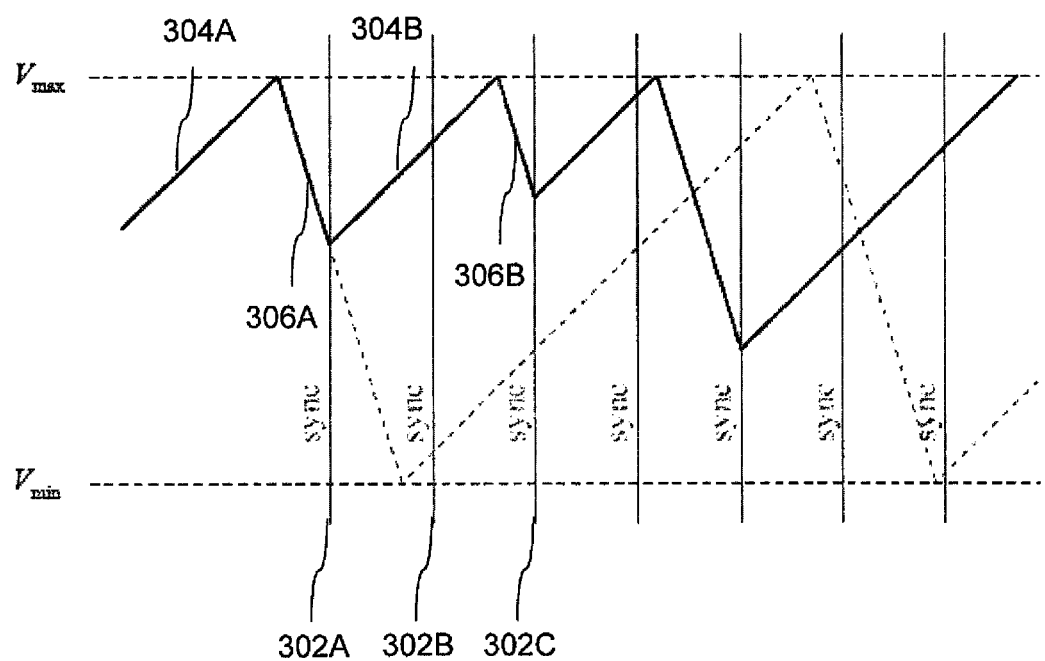
FIG. 3 shows a chaotic saw tooth oscillator.

FIG. 3 shows a chaotic saw tooth oscillator. The chaotic oscillator may have a different behavior, e.g. complementary behavior, to the synchronized saw-tooth oscillator. As shown in FIG. 3, the synchronization event 302, e.g. synchronization signal 302A, 302B, 302C etc, may be active on the falling edge 306 and, therefore, may result in k larger than 1 (as slope before synchronization event 302 is larger than slope after synchronization event 302), therefore, forcing a a chaotic evolution.

Figure 4A:
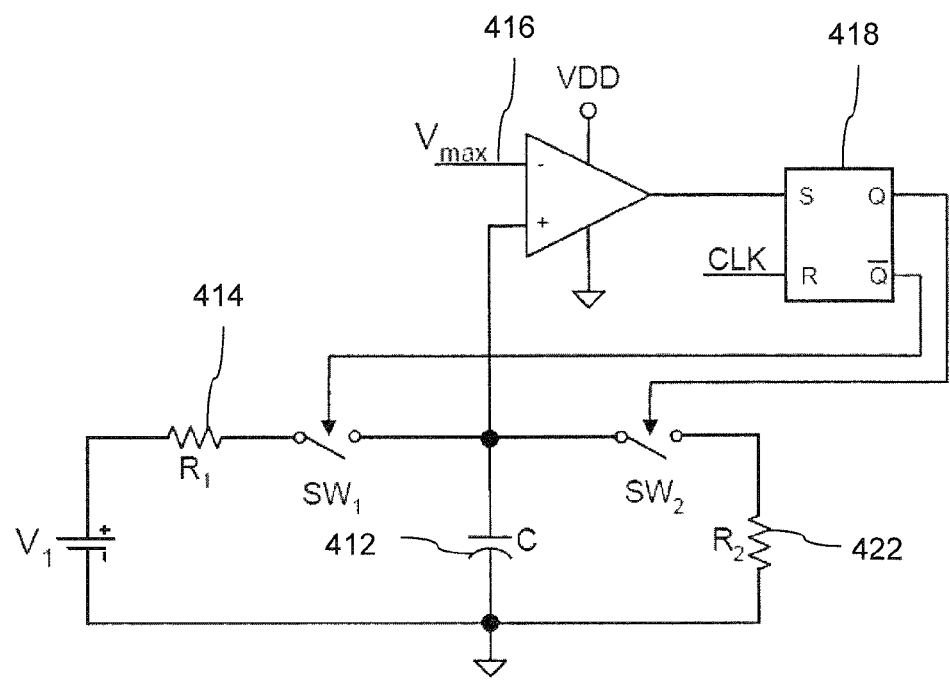
FIG. 4A shows a chaotic oscillator circuit.
Figure 4B:
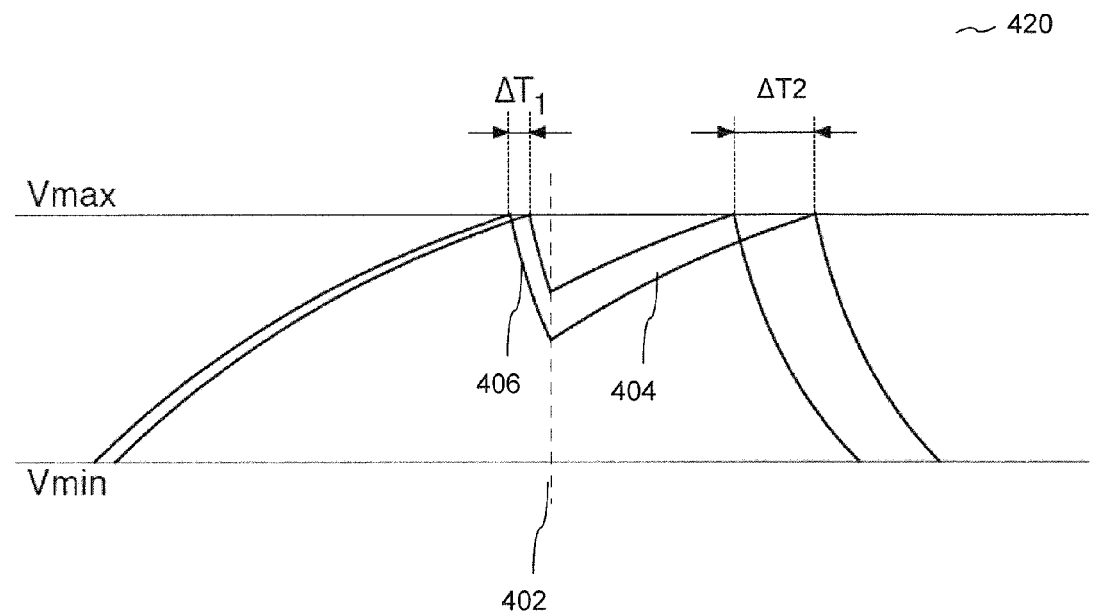
FIG. 4B shows evolution of a chaotic signal.
Figure 4C:
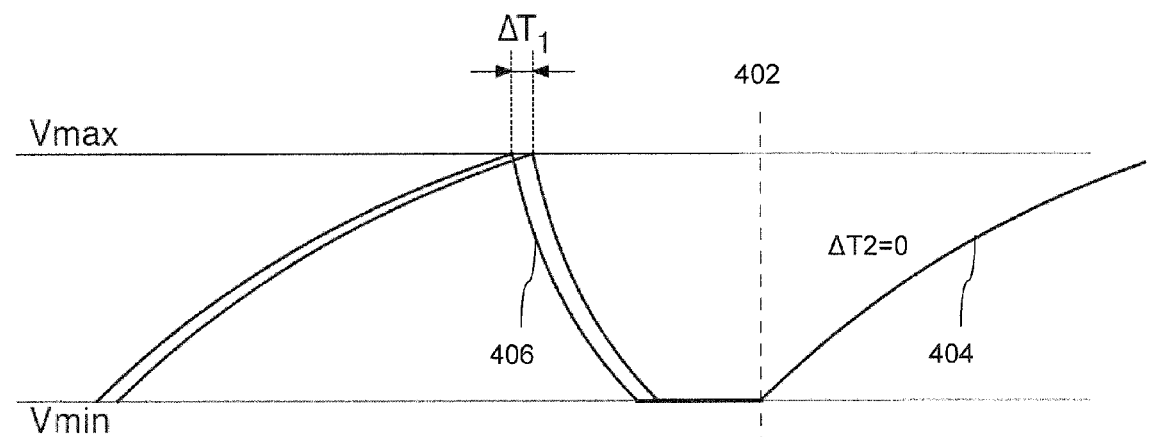
FIG. 4C shows evolution of a chaotic signal.

FIG. 4A shows a chaotic oscillator circuit 410. A capacitor 412 with capacitance C may be charged up with a time constant $R_1 C$ via resistor $R_1$ 414, as long as a reference voltage Vmax 416 may be reached. Reaching Vmax 416 may set a set-reset SR-latch 418 which stops the charging phase and starts discharging C with a time constant $R_2 C$ via resistor $R_2$ 422. Resistance values $R_2$ and $R_1$ may be selected wherein time constants $R_2C$ may be smaller than $R_1C$. In other words, the gradient of the discharge slope may be larger than the gradient in charging slope. If, during the discharging phase (falling edge), a synchronization event occurs, circuit 410 switches back to the charging phase. A drawback of the solution is the constraint on the frequency of the synchronization signal 402 which must be satisfied in order to maintain the chaotic evolution. In other words, the frequency of the synchronization signal must be fast enough to have at least one synchronization event 402 during the time the oscillator 410 needs for a complete falling edge 406 from Vmax to Vmin, as shown in FIG. 4B. If this condition is not satisfied and/or verified as shown in FIG. 4C and the oscillator 410 saturates at Vmin, the circuit may be synchronized by the next synchronization event 402 and may lose the memory of its previous chaotic evolution. i.e. the state is reset.

Furthermore, if the frequency of the synchronization signal 402 is too high, the oscillator 410 may be forced to oscillate with very small amplitude close to Vmax and the non-idealities of the circuit, e.g. comparator offset, may become dominant. Therefore, a bilateral condition of the synchronization frequency must be satisfied, e.g. over corners, e.g. power supply, e.g. temperature in order to preserve the chaotic oscillation.

Various embodiments provide a chaotic saw-tooth oscillator wherein the constraint of the frequency of the synchronization signal may be removed.

Figure 5:
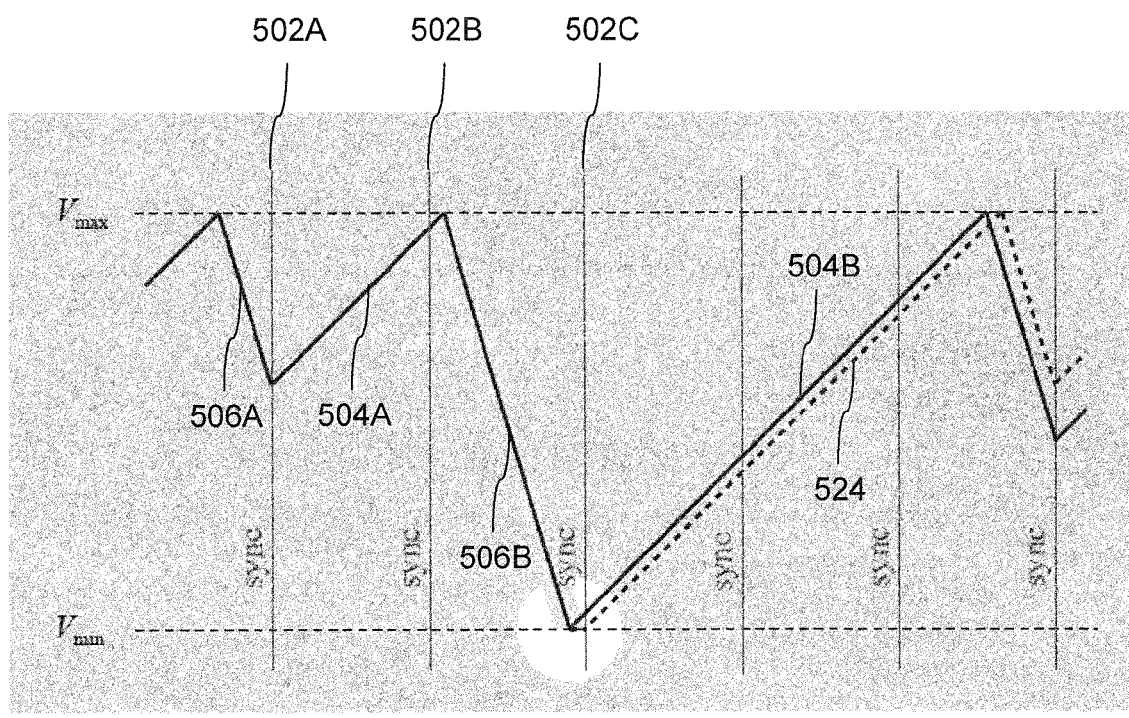
FIG. 5 shows a generated chaotic signal according to an embodiment.

FIG. 5 shows a generated chaotic signal 510 according to an embodiment.

If the signal generator, e.g. the oscillator, reaches Vmin before a synchronization event occurs, the oscillator may behave as a free oscillator, i.e. changing its slope and thus avoiding that the state be saturated.

In other words, only the ratio k between the absolute values of the two slopes (gradients), i.e. S1 and S2 may be important for the chaotic evolution. In other words, maintaining a chaotic evolution may no longer depend on frequency of the synchronization events.

Furthermore, chaotic evolution may be guaranteed whenever the system evolves according to the following conditions (1), (2), (3) and (4):

(1) Fast [sync] to Slow. In other words, the synchronization event 502 may force a change from fast to slow slope. In FIG. 5, synchronization event 502A may force a change from fast falling slope 506A with gradient S1 to a slow rising slope 504A with gradient S2, wherein S1 is larger than S2.

(2) Slow [(v=Vmax) or (v=Vmin)] to Fast. In other words, saturation at Vmax and Vmin may force a change from slow to fast slope. In FIG. 5, saturation at Vmax of slow rising slope 504A may force a change from slow slope 504A with gradient S2 to fast slope 506B with gradient S1.

(3) Rise [(v=Vmax)] to Fall. In other words, saturating at Vmax may force a change in the slope direction (from rising to falling). In FIG. 5, saturation at Vmax of slow rising slope 504A may force a change from slow rising slope 504A to fast falling slope 506B.

(4) Fall [(v=Vmin)] to Rise. In other words, saturating at Vmin may force a change in the slope direction (from falling to rising). In FIG. 5, saturation at Vmax of fast falling slope 506B may force a change from fast falling slope 506B to slow rising slope 504B.

Condition (1) may generate a de-synchronization, e.g. an exponential de-synchronization. Condition (2) may establish the iteration with condition (1). Conditions (3), (4) may avoid the saturation in case of a missed synch, as earlier described. For example, wherein the circuit may be synchronized by synchronization event 502C and may lose the memory of its previous chaotic evolution. i.e. the state is reset. A loss of memory of its previous chaotic evolution may be shown, as indicated by dotted signal trace 524, which indicates a reset of the signal at synchronization event 502C. It may be understood that although FIG. 5 shows a signal oscillation signal with a slow rising slope and a fast falling slope, the embodiment may also be applied to a signal oscillation signal with a fast rising slope and a slow falling slope. In other words, chaotic behavior may be generated by conditions (1) and (2) and conditions (3) and (4) may avoid saturation.

A method for generating a chaotic signal such as 510 may include:

providing a first signal 502 (synchronization signal) having a first signal frequency;

providing a second signal 504, 506 having a second signal frequency (e.g. fast slope) or a third signal frequency (e.g. slow slope), wherein the second signal frequency is higher than the third signal frequency;

switching the second signal 504, 506 having the second signal frequency (e.g. fast slope) to the third signal frequency (e.g. slow slope), based on a predefined first signal event (synchronization event) of the first signal 502; and returning the second signal 504, 506 having the third signal frequency (e.g. slow slope), to the second signal frequency (e.g. fast slope) in response to a predefined second signal event (e.g. Vmin or Vmax).

Figure 6:
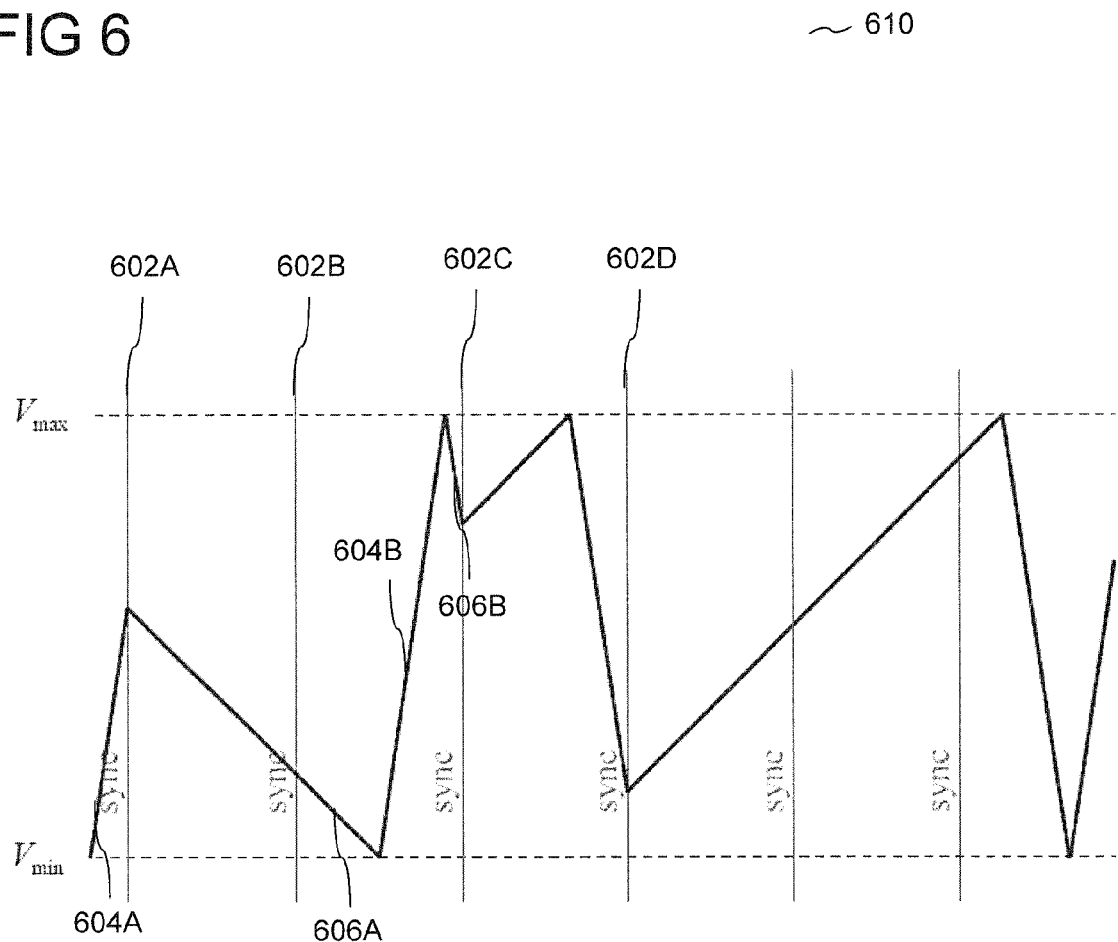
FIG. 6 shows a generated chaotic signal according to an embodiment.

FIG. 6 shows a generated chaotic signal 610 according to an embodiment. Signal 610 shows the evolution of an oscillator, according to the following conditions (5), (6) and (7).

(5): Generated signal 610 may change its slope and direction every time there is a synchronization event during a fast slope. For example, at synchronization event 602A and 602D, a fast slope changes slope and direction.

(6): If at least one of Vmin and Vmax may be reached with a slow slope, both slope and direction may change. For example, slow slope 606A reaches Vmin and changes both slope and direction to fast slope 604B.

(7) If at least one of Vmin and Vmax may be reached with a fast slope, the direction may change but the slope remains fast. For example, fast slope 604B reaches Vmax and changes to fast slope 606B. i.e. it changes direction, but the slope remains fast.

In this case, if the frequency of synchronization events increases, the oscillation amplitude may decrease.

Figure 7:
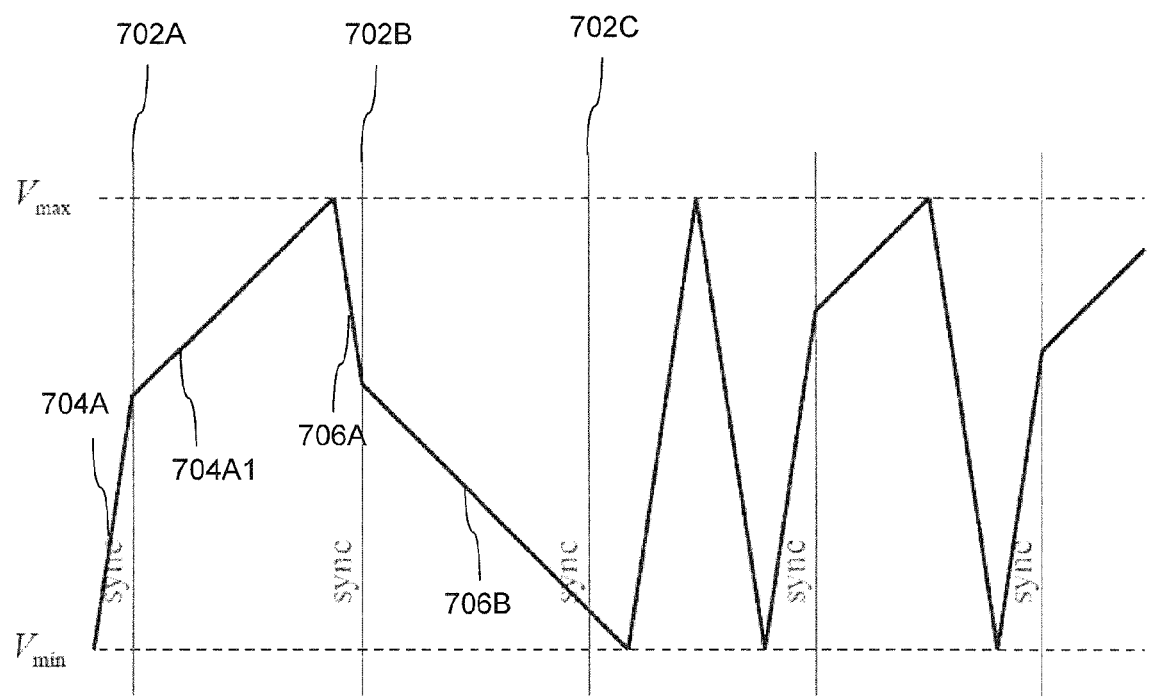
FIG. 7 shows a generated chaotic signal according to an embodiment.

FIG. 7 shows a generated chaotic signal 710 according to an embodiment. Signal 710 shows the evolution of an oscillator, according to conditions (5), (6) and (7) as described previously. Except that condition (5) may be altered to wherein a synchronization event 702 during a fast slope may force a change of slope from fast to slow) but not a change of direction. For example, synchronization events 702A and 702B may cause a change of fast slope to slow slope, e.g. fast rising slope 704A to slow rising slow 704A1, e.g. fast falling slope 706A to slow falling slope 706B. Therefore, signal 710 may swing from Vmin to Vmax independently from the synchronization frequency and even if the synchronization event is missing.

Various embodiments provide a signal generator, e.g. a chaotic saw-tooth oscillator, without any critical constraints to guarantee the chaotic evolution. The signal generator, e.g. the oscillator, may be used to implement a robust, low area and low current random bit generator suitable to be integrated in a radio frequency identification integrated circuit (RFID IC).

In addition, a generalized chaotic saw-tooth oscillator is defined and different alternative implementations are discussed.

It may be understood that although various embodiments and figures show generally a saw-tooth oscillator, e.g. saw-tooth signals, various embodiments are not limited to saw-tooth signals, but may include any oscillating signals, e.g. square wave signals, e.g. cosine signals, sine wave signals. For example, the chaotic oscillator circuit 410 as shown in FIG. 4A is implemented with two different time constants.

FIG. 8 shows method 810 for generating a signal according to an embodiment. Method 810 may include:

providing a first signal having a first signal frequency (in 810);

providing a second signal having a second signal frequency or a third signal frequency, wherein the second signal frequency is higher than the third signal frequency (in 820);

switching the second signal having the second signal frequency to the third signal frequency based on a predefined first signal event of the first signal (in 830); and returning the second signal having the third signal frequency to the second signal frequency in response to a predefined second signal event (in 840).

Figure 9A:
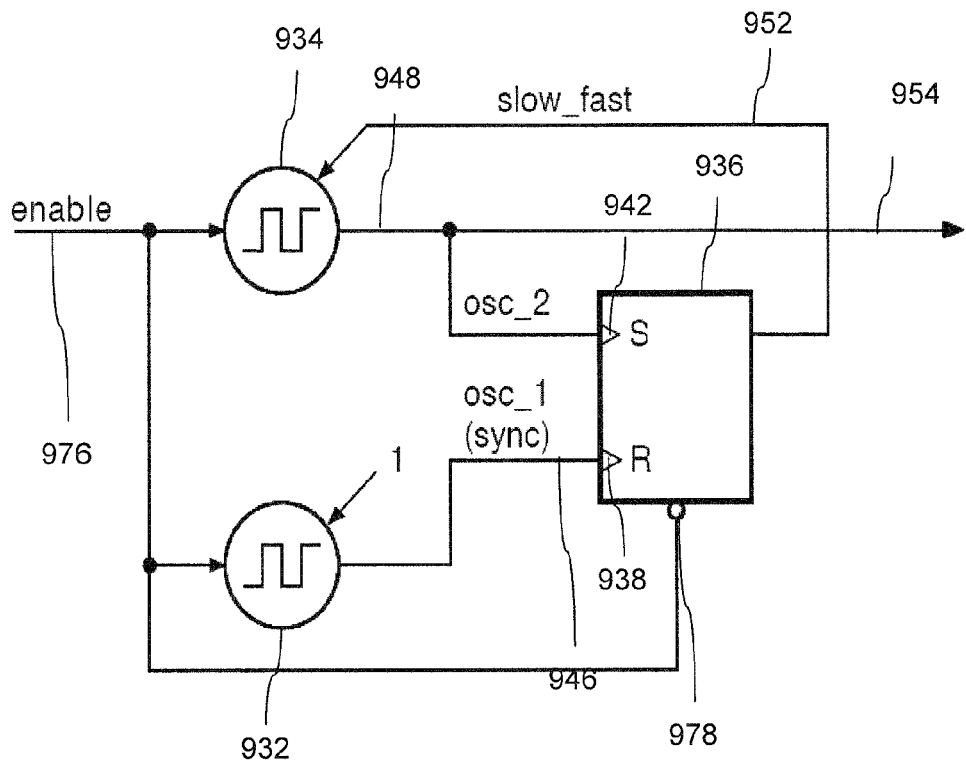
FIGS. 9A and 9B shows a signal generation circuit according to an embodiment.

FIG. 9A shows signal generation circuit 910 according to an embodiment. Signal generation circuit 910 may include first signal generator 932 configured to provide a first signal osc1 946 having a first signal frequency and second signal generator 934 configured to provide a second signal osc2 948 having a second signal frequency or a third signal frequency, wherein the second signal frequency is higher than the third signal frequency. Signal generation circuit 910 may include switching circuit 936 configured to switch the second signal osc2 948 having the second signal frequency to the third signal frequency in response to a predefined first signal event of the first signal osc1 946, and to switch the second signal osc2 948 having the third signal frequency to the second signal frequency in response to a predefined second signal event slow_fast_s 952. Second signal osc2 948 frequency may switch according to control signal slow_fast_s 952. The active edges of first signal osc1 946 may be the synchronization signal.

At least one of first signal generator 932 and second signal generator 934 may include an oscillator circuit.

First signal generator 932 may include a fixed frequency oscillator circuit.

Second signal generator 934 may include a variable frequency oscillator circuit.

The first signal frequency may be equal to or smaller than the second signal frequency. The third frequency may be smaller than the second signal frequency. For example, the first signal frequency may be approximately 2 MHz, and the second signal frequency may be approximately 2 MHz or larger. The third signal frequency may be smaller than the second signal frequency and/or the first signal frequency. For example, the third signal frequency may be 1 MHz.

Switching circuit 936 may include a set-reset flip flop circuit, e.g. an edge triggered set-reset circuit (an implementation of which is shown in FIG. 9A), or any other type of a suitable latching circuit, wherein a first input 938, e.g. a reset input 938, may be connected to first signal generator 932 and a second input 942, e.g. a set input 942, may be connected to the second signal generator 934.

Figure 9B:
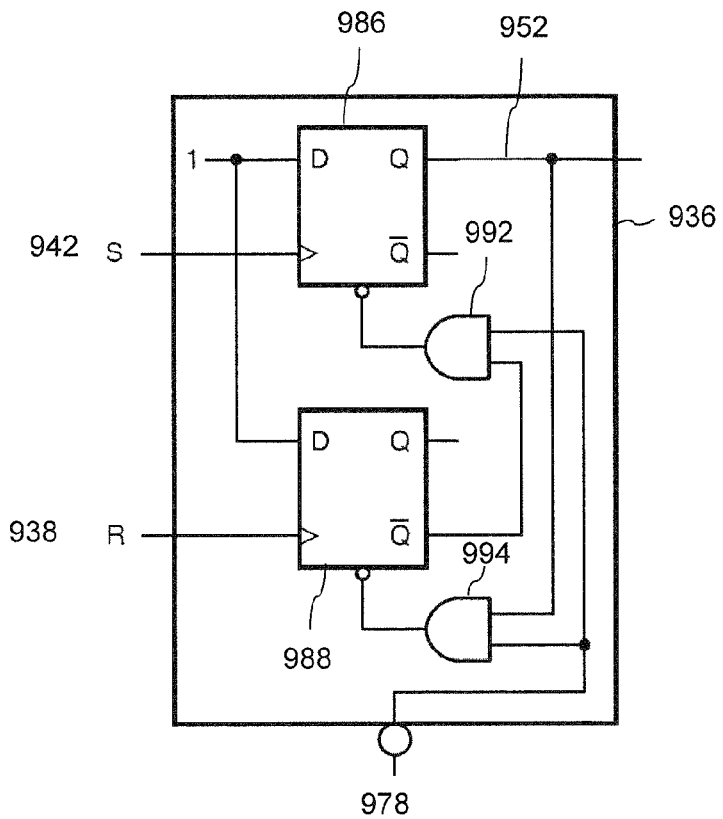

An edge triggered set-reset circuit 936 is shown in FIG. 9B. Edge-triggered set-reset circuit 936 may include at least one first D flipflop (DFF) 986 connected to a second D flip-flop (DFF) 988 via first AND gate 992 and second AND gate 994. Osc2 948 may be connected to second input 942 of first DFF 986. Osc1 946 may be connected to first input 938 of second DFF 988.

Switching circuit 936 may be configured to output a generated signal slow_fast_s 952 based on the first predefined signal event or the second predefined signal event, e.g. based on at least one of the first predefined signal event or the second predefined signal event.

The first predefined signal event may be dependent on the first signal. The first predefined signal event may include an edge trigger of the first signal, e.g. a lead edge of the first signal, e.g. a falling edge of the first signal. e.g. a level trigger from the first signal, e.g. a hybrid edge-level trigger from the first signal.

The second predefined signal event may be dependent on the second signal. The second predefined signal event may include an edge trigger of the second signal, e.g. a lead edge of the second signal, e.g. a falling edge of the second signal, e.g. a level trigger from the second signal, e.g. a hybrid edge-level trigger from the second signal.

Switching circuit 936 may be configured to deliver generated signal slow_fast_s 952 as a switching signal to second signal generator 934 to switch between providing second signal osc_2 having a second signal frequency or a third signal frequency. Switching circuit 936 may be configured to deliver generated signal slow_fast_s 952 from switching circuit 936 to second signal generator 934 based on the first predefined signal event or the second predefined signal event.

Switching circuit 936 may be configured to deliver a switching signal slow_fast_s 952 to second signal generator 934 such that second signal generator 934 switches the second signal having the third signal frequency to the second signal frequency in response to an edge trigger of the second signal.

Switching circuit 936 may be configured to deliver a switching signal slow_fast_s 952 to second signal generator 934 such that second signal generator 934 switches the second signal having the second signal frequency to the third signal frequency in response to an edge trigger of the first signal.

Signal generator circuit 910 is shown without additional post-processing circuits. The outputs of two oscillator circuits, e.g. first signal generator 932 and second signal generator 934, may for example, drive an edge-triggered set-reset flip-flop 936 which provides the control signal slow_fast_s 952. The two oscillator circuits, e.g. first signal generator 932 and second signal generator 934 may be nominally identical oscillators (osc1 946, osc2 948). The oscillator period of osc1 946 may be fixed (fast) while osc2 948 may be switched between a fast and a slow value according to slow_fast_s 952.

Switching signal slow_fast_s 952 may be input to processing circuit 944. Processing circuit 944 may include a D flip flop circuit 964. Switching signal slow_fast_s 952 may be connected to an input 966, e.g. a clock input 966, of D flip flop circuit 964. D flip flop circuit 964 may be configured to output signal osc_o 954. Output signal osc_o 954 may be inverted via inverter 968, and further feedback coupled to a further input terminal, e.g. D input 972, of D flip flop circuit 964. D flip flop circuit 964 may further include inverting input terminal 974 connected to enable terminal 976. Enable terminal 976 may be further connected to an inverting input terminal 978 of switching circuit 936, and to first signal generator 932 and second signal generator 934.

Figure 9C:
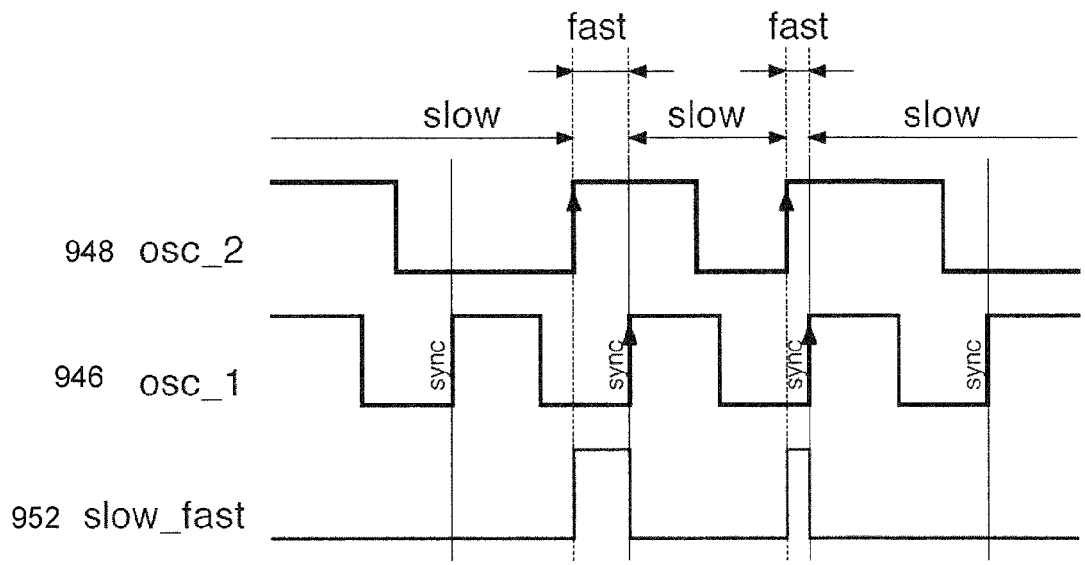
FIGS. 9C and 9D show signals generated by the signal generation circuit according to an embodiment.

For example, as shown in FIG. 9C on every edge, e.g. rising edge, of second signal osc2 948, switching signal slow_fast_s 952 may be set to "1". Switching signal slow_fast_s 952 may switch second signal osc2 948 to the fast configuration, e.g. to second signal frequency. On the next osc1 946 edge, e.g. rising edge, slow_fast_s 952 may be reset to "0". Second signal osc2 948 may be forced back to the slow configuration, e.g. to third frequency.

Figure 9D:
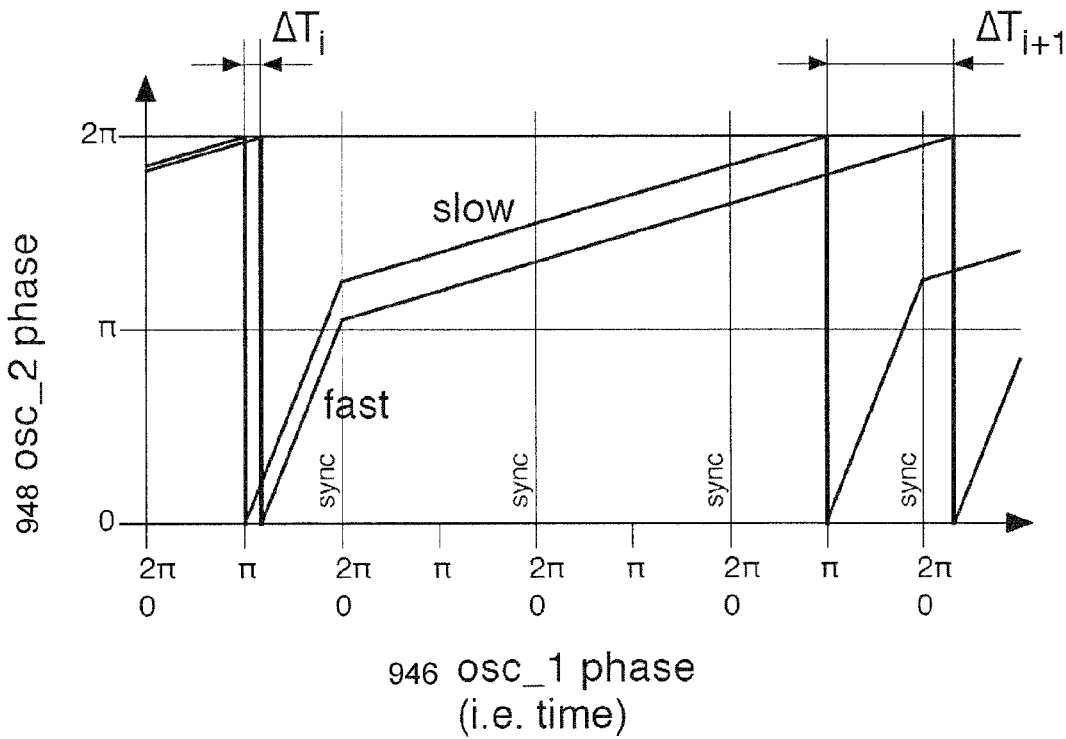

Therefore, as shown in FIG. 9D, a small jitter $\Delta T_i$ on osc1 946 may be amplified by the ratio of S1/S2, i.e. ratio of fast slope to slow slope, and may result in a larger jitter $\Delta T_{i+1}$ on osc2 948. FIG. 9C shows the phase of second signal osc2 948 versus the phase of first signal osc1 946. The slope of the signals may represent the phase evolution of the signals, and the respective phases of the signals of the two oscillators are considered. A steep (fast slow) may represent a short time period, whereas a gentle (slow slope) may represent a long time period. After some osc1 946 sampling events, the jitter of the output signal slow_fast_s 952 may increase exponentially. Output osc_o 954 may be derived directly from osc_2 948.

Various embodiments provide a method for generating a signal. The method may include: providing a first signal osc1 946 having a first signal frequency; providing a second signal osc2 948 having a second signal frequency or a third signal frequency, wherein the second signal frequency may be higher than the third signal frequency; switching the second signal osc2 948 having the second signal frequency to the third signal frequency based on a predefined first signal event of the first signal osc1 946; and returning the second signal osc2 948 having the third signal frequency to the second signal frequency in response to a predefined second signal event osc2 948.

According to an embodiment, the first signal frequency may be equal to or smaller than the second signal frequency. According to an embodiment, the first signal frequency may be equal to or smaller than the second signal frequency. According to an embodiment, the second signal frequency may larger than the third signal frequency.

According to an embodiment, the first predefined signal event may include a trigger from the first signal, e.g. an edge trigger from the first signal, e.g. a level trigger from the first signal, e.g. a hybrid edge-level trigger from the first signal. According to an embodiment, the first predefined signal event may include an interrupt signal from the first signal.

According to an embodiment, the second predefined signal event may include a trigger from the second signal, e.g. an edge trigger from the second signal, e.g. a level trigger from the second signal, e.g. a hybrid edge-level trigger from the second signal. According to an embodiment, the second predefined signal event may include an interrupt signal from the second signal.

According to an embodiment, the method may further include generating an output signal slow_fast_s 952 based on the first predefined signal event or the second predefined signal event.

The output signal slow_fast_s 952 may be generated on the first predefined signal event or the second predefined signal event, wherein the first predefined signal event may be dependent on the first signal and wherein the second predefined signal event may be dependent on the second signal.

The output signal slow_fast_s 952 may be delivered as a switching signal for switching between providing a second signal having a second signal frequency or a third signal frequency. The switching signal slow_fast_s 952 may be delivered for switching between providing a second signal having a second signal frequency or a third signal frequency. Furthermore, the switching signal slow_fast_s 952 may be based on the first predefined signal event or the second predefined signal event.

Therefore, switching signal slow_fast_s 952 may be changed to a first state to switch second signal osc2 948 to the fast configuration, e.g. to second signal frequency, in response to a trigger from second signal osc2 948. Furthermore, switching signal slow_fast_s 952 may be changed to a second state to switch second signal osc2 948 to the slow configuration, e.g. to third signal frequency, in response to a trigger from first signal osc1 946.

Figure 10A:
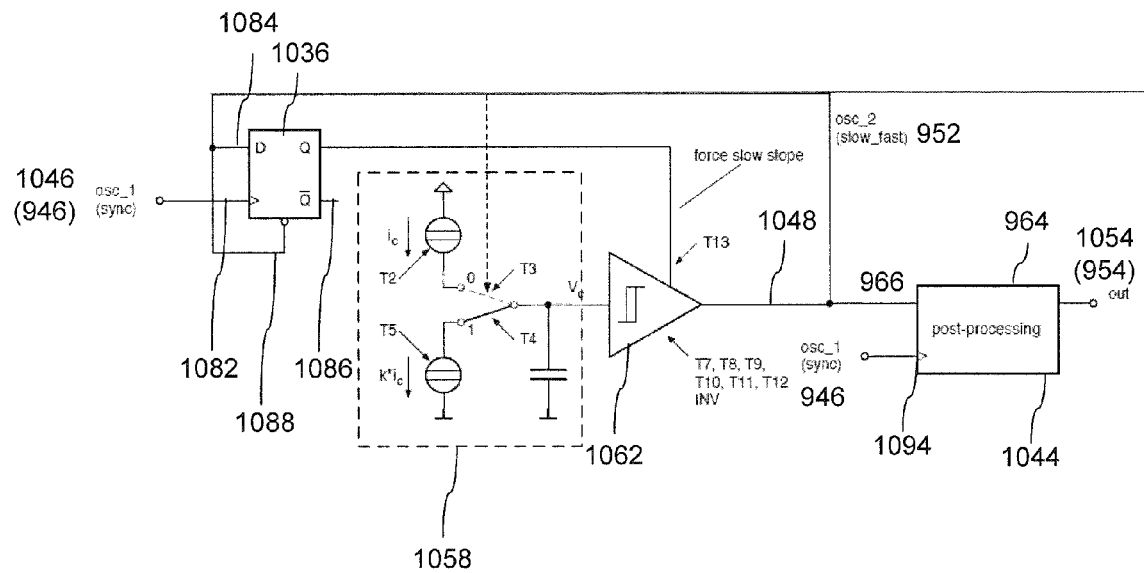
FIG. 10A shows a signal generation circuit according to an embodiment.
Figure 10B:
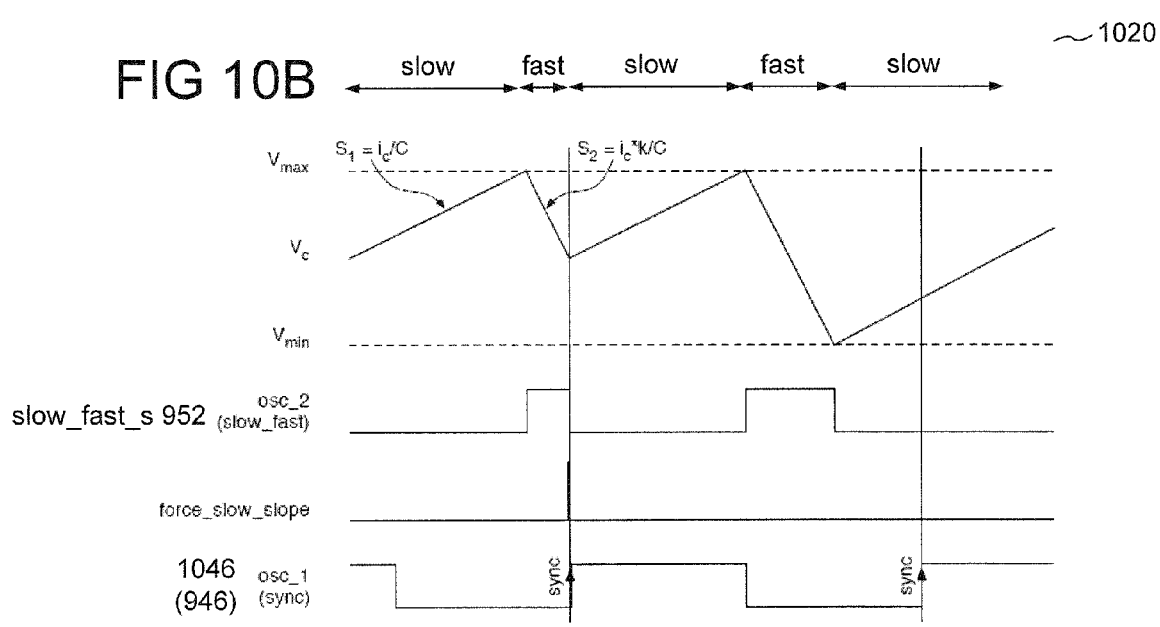
FIG. 10B shows signals generated by the signal generation circuit according to an embodiment.

FIGS. 10A and 10B show signal generation circuit 1010 and a diagram of signals according to an embodiment. Signal generation circuit 1010 may be configured to generate a chaotic signal. Signal generation circuit 1010 may include a CMOS implementation of a saw-tooth chaotic oscillator as shown in FIG. 5, e.g. signal 510.

Signal generation circuit 1010 may include a compact implementation of an oscillator, e.g. a saw-tooth oscillator, suitable for the integration in radio frequency identification RFID integrated circuits.

Signal generation circuit 1010 may include a plurality of devices, e.g. one or more transistors, one or more capacitors, e.g. one or more post processing circuits. According to an embodiment, as shown in FIG. 10 signal generation circuit 1010 may include a plurality of transistors, T2, T3, T4, T5, T7, T8, T9, T10, T11, T12, T13. According to an embodiment, signal generation circuit 1010 may include delay flip-flop DFF circuit 1036. DFF circuit 1036 may be connected, e.g. directly connected, to ramp generator circuit 1058 and further connected, e.g. directly connected, to Schmitt trigger circuit 1062.

DFF circuit 1036 may include clock input terminal 1082, D input terminal 1084, $\overline{Q}$ output terminal 1086 and clear CLR terminal 1088. Clock input terminal 1082 may be configured to receive synchronization input signal 1046, e.g. which may be an edge trigger of first signal osc1 946. Clear CLR terminal 1088 of DFF circuit 1036 may be connected, e.g. directly connected, to ramp generator circuit 1058.

Ramp generator circuit 1058 may include a plurality of transistors, e.g. T2, T3, T4, T5, e.g. PMOS transistors, and NMOS transistors.

Ramp generator circuit 1058 may be connected, e.g. directly connected, to Schmitt trigger circuit 1062.

Output of Schmitt trigger circuit 1062 may be further connected, e.g. directly connected, to an input of post processing circuit 1044. Post processing circuit 1044 may further include a clock input terminal 1094, wherein synchronization input signal 1046 may be connected, e.g. directly connected, to clock input terminal 10494. Post processing circuit 1044 may output an output signal 1054.

In addition, signal generation circuit 1010 may include one or more post-processing circuits, e.g. digital post-processing, for post-processing. Since there may be few or no critical parameters or few or no critical matching constraints, huge transistors may not be needed.

Signal generation circuit 1010 may be modified with a few minor changes to implement more complex oscillators, e.g. to generate signals such as signal 610 or signal 710. One or more additional transistors may be added to the ramp generator. One or more additional flip-flops and logic gates may be added in the finite state machine.

The performance (random bits/s) may be easily scaled, even dynamically by changing the current reference bias. If the synchronization is generated by a matched oscillator using the same bias, changing the bias of the whole generator may scale its speed but the behavior may remain the same, e.g. k may not change. Therefore, different trade-offs speed vs. power consumption may be easily set, even dynamically, adjusting the power consumption depending on the required throughput.

The output bit stream may include the oscillator status (slow/rise, fast/fall, slow/fall, fast/rise) sampled by the sync signal. The entropy of the output sequence may depend on the number of sync events (i.e. sync occurrences during a fast slope) and on k. Therefore, since k may be assumed constant and it may be conservatively estimated, it may be possible to perform a real time entropy estimate by counting the number of synchronization events.

It may be understood that DFF circuit 1036, ramp generator circuit 1058 and Schmitt trigger circuit 1062 may be configured to perform the function of a switching circuit, e.g. switching circuit 936 as described previously.

As shown in FIG. 10B, a predefined event, e.g. a predefined second signal event, switching signal slow_fast_s 952 may be set to "1". Switching signal slow_fast_s 952 may switch second signal osc2 948 to fast configuration, e.g. to second signal frequency. On the next osc1 946 edge, e.g. rising edge, i.e. the predefined first signal event of the first signal, slow_fast_s 952 may be reset to "0". Second signal osc2 948 may be forced back to the slow configuration, e.g. to third frequency.

Figure 11:
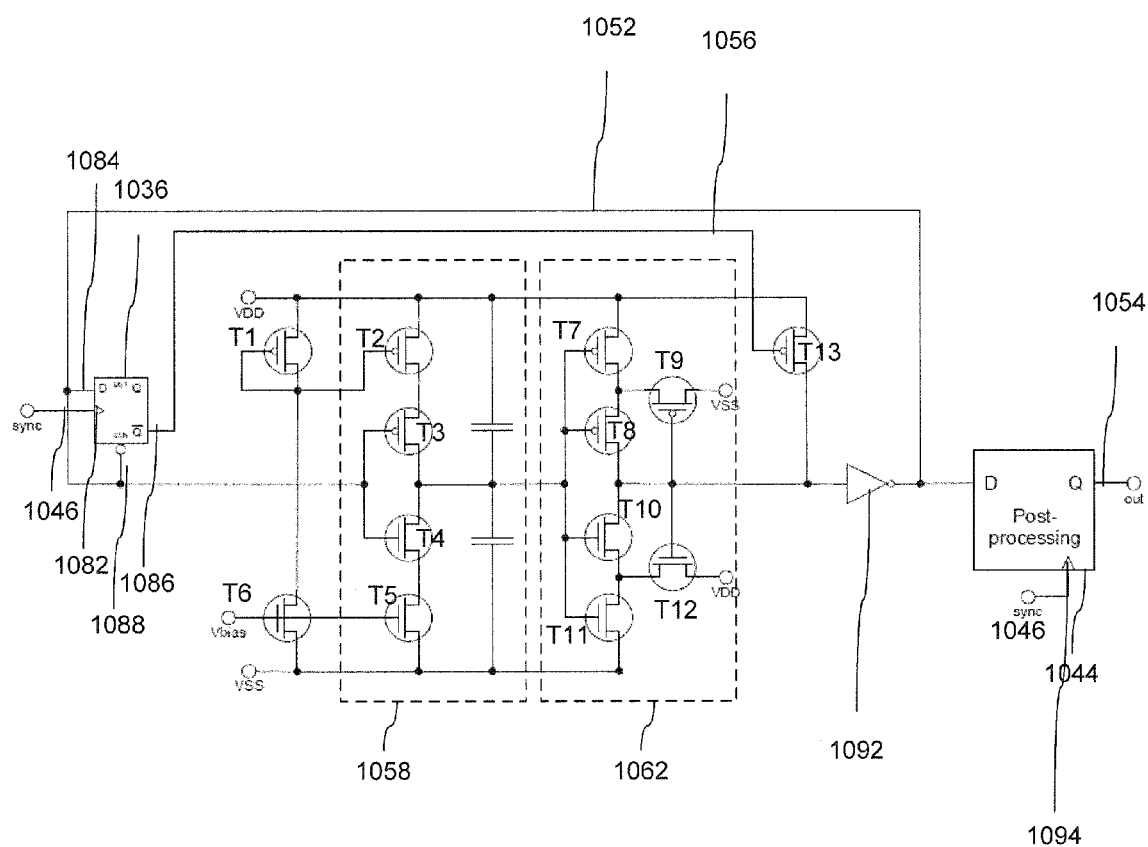
FIG. 11 shows a signal generation circuit according to an embodiment.

FIG. 11 shows a CMOS implementation of the saw-tooth chaotic oscillator as described in FIG. 10A. Ramp generator circuit 1058 may include transistor T2, T3, T4, T5. Schmitt trigger circuit 1062 may include transistors T7 T8, T9, T10, T11, T12.

A first source/drain (S/D) terminal of T1 may be connected, e.g. directly connected, to VDD. A second S/D terminal of T1 may be connected, e.g. directly connected, to first S/D terminal of T6. Gate terminal of T1 may be connected, e.g. directly connected, to second S/D terminal of T1, and further connected, e.g. directly connected, to gate terminal of T2. First S/D terminal of T1 may be connected, e.g. directly connected, to first S/D terminal of T2. First S/D terminal of T2 may be connected, e.g. directly connected, to VDD. Second S/D terminal of T2 may be connected, e.g. directly connected, to first S/D terminal of T3. Second S/D terminal of T3 may be connected, e.g. directly connected, to first S/D terminal of T4. Second S/D terminal of T4 may be connected, e.g. directly connected, to first S/D terminal of T5. Gate terminal of T3 may be connected, e.g. directly connected, to gate terminal of T4. Gate terminal of T3 and gate terminal of T4 may each be connected, e.g. directly connected, to clear CLR input 1088 of DFF circuit 1036. Second S/D terminal of T1 and first S/D terminal of T6 may each be connected, e.g. directly connected, to clear CLR input 1088 of DFF circuit 1036.

Gate terminal of T5 and gate terminal of T6 may each be connected, e.g. directly connected, to Vbias. Vss may be connected, e.g. directly connected, to second S/D terminal of T6 and second S/D terminal of T5. Ramp generator may further include capacitors C1 and C2 connected, e.g. directly connected, in series. A first terminal of capacitor C1 may be connected, e.g. directly connected, to VDD and first S/D terminals of T1 and T2. A second terminal of capacitor C1 may be connected, e.g. directly connected, to second S/D terminal of T3 and first S/D terminal of T4. A first terminal of capacitor C2 may be connected, e.g. directly connected, to second terminal of capacitor C1 and second S/D terminal of T3 and first S/D terminal of T4. Second terminal of capacitor C2 may be connected, e.g. directly connected, to Vss, second S/D terminal of T6 and second S/D terminal of T5.

Schmitt trigger circuit may include seventh transistor T7, eight transistor T8, ninth transistor T9, tenth transistor T10, eleventh transistor T11 and twelfth transistor T12. Seventh transistor T7, eight transistor T8 and ninth transistor T9, may exhibit a response opposite, e.g. inverse, to that of tenth transistor T10, eleventh transistor T11 and twelfth transistor T12. For example, seventh transistor T7, eight transistor T8 and ninth transistor T9, may each include, for example a PMOS transistor, whereas tenth transistor T10, eleventh transistor T11 and twelfth transistor T12 may each include, for example a NMOS transistor.

First S/D terminal of T7 may be connected, e.g. directly connected, to VDD, first S/D terminal of T1 and first S/D terminal of T2. Second S/D terminal of T7 may be connected, e.g. directly connected, to first S/D terminal of T8 and first S/D terminal of T9. Gate terminals of T7, T8, T10 and T11 may be connected, e.g. directly connected, to each other. Gate terminals of T7, T8, T10 and T11 may be connected, e.g. directly connected, to second terminal of C1 and first terminal of C2. Second S/D terminal of T8 may be connected, e.g. directly connected, to first S/D terminal of T10 and gate terminal of T9. Gate terminal of T9 may be further connected, e.g. directly connected, to gate terminal of T12.

Second S/D terminal of T10 may be connected, e.g. directly connected, to first S/D terminal of T12 and first S/D terminal of T11. Second S/D terminal of T11 may be connected, e.g. directly connected, to Vss, and further connected, e.g. directly connected, to second terminal of capacitor C2, second S/D terminal of T6 and second S/D terminal of T5.

Second S/D terminal of T9 may be connected, e.g. directly connected, to VSS. Second terminal of T12 may be connected, e.g. directly connected, to VDD.

Schmitt trigger circuit 1062 may be further connected, e.g. directly connected, to post processing circuit 1044. Gate terminals of T9 and T12 may be connected, e.g. directly connected, to input terminal of inverter 1092. First S/D terminal of T7 may be connected, e.g. directly connected, to first S/D terminal of T13. Second S/D terminal of T13 may be connected, e.g. directly connected, to input terminal of inverter 1092. Gate terminal of T13 may be connected, e.g. directly connected, to $\overline{Q}$ output terminal 1086 of DFF circuit 1036. Output of inverter 1092 may be connected, e.g. directly connected, to D input terminal 1084 of DFF circuit 1036, and further connected, e.g. directly connected, to clear CLR terminal 1088 of DFF circuit 1036. Output of inverter 1092 may be further connected, e.g. directly connected, to an input of post processing circuit 1044.

FIG. 12 shows method 1200 for generating a signal according to an embodiment. Method 1200 may include:

providing, by a first signal generator, a first signal having a first signal frequency (in 1210);

providing, by a second signal generator, a second signal having a second signal frequency or a third signal frequency, wherein the second signal frequency is higher than the third signal frequency (in 1220);

providing, by a switching circuit, an output signal based on a predefined first signal event of the first signal and a predefined second signal event, for switching the second signal having the second signal frequency to the third signal frequency based on the predefined first signal event and for returning the second signal having the third signal frequency to the second signal frequency based on the predefined second signal event (in 1230).

Various embodiments provide a compact and low power implementation of a chaotic oscillator circuit whose power consumption may be easily dynamically adjusted according to the required throughput and the available current.

Various embodiments provide a method for generating a signal, the method including: providing a first signal having a first signal frequency; providing a second signal having a second signal frequency or a third signal frequency, wherein the second signal frequency is higher than the third signal frequency; switching the second signal having the second signal frequency to the third signal frequency based on a predefined first signal event of the first signal; and returning the second signal having the third signal frequency to the second signal frequency in response to a predefined second signal event.

According to an embodiment, providing a first signal having a first signal frequency includes providing a first signal having a fixed first signal frequency; and wherein providing a second signal having a second signal frequency or a third signal frequency includes providing a second signal having a variable frequency including a second signal frequency or a third signal frequency According to an embodiment, providing a first signal having a first signal frequency and providing a second signal having a second signal frequency or a third signal frequency includes providing a first signal having a first signal frequency and providing a second signal having a second signal frequency wherein the first signal frequency is equal to or smaller than the second signal frequency.

According to an embodiment, the method further includes generating an output signal based on the first predefined signal event or the second predefined signal event.

According to an embodiment, the method further includes generating an output signal based on the first predefined signal event or the second predefined signal event wherein the first predefined signal event is dependent on the first signal and wherein the second predefined signal event is dependent on the second signal.

According to an embodiment, switching the second signal having the second signal frequency to the third signal frequency based on a predefined first signal event of the first signal, includes switching the second signal having the second signal frequency to the third signal frequency based on a predefined first signal event of the first signal wherein the first predefined signal event includes an edge trigger of the first signal.

According to an embodiment, returning the second signal having the third signal frequency to the second signal frequency in response to a predefined second signal event of the second signal, includes returning the second signal having the third signal frequency to the second signal frequency in response to a predefined second signal event of the second signal, wherein the second predefined signal event includes an edge trigger of the second signal.

According to an embodiment, the method further includes delivering the output signal as a switching signal for switching between providing a second signal having a second signal frequency or a third signal frequency.

According to an embodiment, delivering a switching signal for switching between providing a second signal having a second signal frequency or a third signal frequency includes delivering a switching signal based on the first predefined signal event or the second predefined signal event.

Various embodiments provide a method for generating a signal, the method including: providing, by a first signal generator, a first signal having a first signal frequency; providing, by a second signal generator, a second signal having a second signal frequency or a third signal frequency, wherein the second signal frequency is higher than the third signal frequency; providing, by a switching circuit, an output signal based on a predefined first signal event of the first signal and a predefined second signal event, for switching the second signal having the second signal frequency to the third signal frequency based on the predefined first signal event and for returning the second signal having the third signal frequency to the second signal frequency based on the predefined second signal event.

Various embodiments provide a signal generation circuit, including a first signal generator configured to provide a first signal having a first signal frequency; a second signal generator configured to provide a second signal having a second signal frequency or a third signal frequency, wherein the second signal frequency is higher than the third signal frequency; a switching circuit configured to switch the second signal having the second signal frequency to the third signal frequency in response to a predefined first signal event of the first signal, and to switch the second signal having the third signal frequency to the second signal frequency in response to a predefined second signal event.

According to an embodiment, at least one of the first signal generator and the second signal generator includes an oscillator circuit.

According to an embodiment, the first signal generator includes a fixed frequency oscillator circuit.

According to an embodiment, the second signal generator includes a variable frequency oscillator circuit.

According to an embodiment, the first signal frequency is equal to or smaller than the second signal frequency.

According to an embodiment, the switching circuit includes a set-reset flip flop circuit having a first input connected to the first signal generator and a second input connected to the second signal generator.

According to an embodiment, the switching circuit is configured to output a generated signal based on the first predefined signal event or the second predefined signal event.

According to an embodiment, the first predefined signal event is dependent on the first signal.

According to an embodiment, the second predefined signal event is dependent on the second signal.

According to an embodiment, the first predefined signal event includes an edge trigger of the first signal and the second predefined signal event includes an edge trigger of the second signal.

According to an embodiment, the switching circuit is configured to deliver the generated signal as a switching signal to the second signal generator to switch between providing a second signal having a second signal frequency or a third signal frequency According to an embodiment, the switching circuit is configured to deliver a switching signal to the second signal generator based on the first predefined signal event or the second predefined signal event.

According to an embodiment, the switching circuit is configured to deliver a switching signal to the second signal generator such that the second signal generator switches the second signal having the third signal frequency to the second signal frequency in response to an edge trigger of the second signal.

According to an embodiment, the switching circuit is configured to deliver a switching signal to the second signal generator such that the second signal generator switches the second signal having the second signal frequency to the third signal frequency in response to an edge trigger of the first signal.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for generating a signal, the method comprising:
providing a first signal having a first signal frequency;
providing a second signal having a second signal frequency or a third signal frequency, wherein the second signal frequency is higher than the third signal frequency;
switching the second signal having the second signal frequency to the third signal frequency based on a predefined first signal event of the first signal;
and returning the second signal having the third signal frequency to the second signal frequency in response to a predefined second signal event;
wherein providing a first signal having a first signal frequency comprises providing a first signal having a fixed first signal frequency; and
wherein providing a second signal having a second signal frequency or a third signal frequency comprises providing a second signal having a variable frequency comprising a second signal frequency or a third signal frequency.

2. The method according to claim 1,
wherein providing a first signal having a first signal frequency and providing a second signal having a second signal frequency or a third signal frequency comprises providing a first signal having a first signal frequency and providing a second signal having a second signal frequency wherein the first signal frequency is equal to or smaller than the second signal frequency.

3. The method according to claim 1, further comprising generating an output signal based on the first predefined signal event or the second predefined signal event.

4. The method according to claim 1, further comprising generating an output signal based on the first predefined signal event or the second predefined signal event wherein the first predefined signal event is dependent on the first signal and wherein the second predefined signal event is dependent on the second signal.

5. The method according to claim 1, wherein switching the second signal having the second signal frequency to the third signal frequency based on a predefined first signal event of the first signal, comprises switching the second signal having the second signal frequency to the third signal frequency based on a predefined first signal event of the first signal wherein the first predefined signal event comprises an edge trigger of the first signal.

6. The method according to claim 1, wherein returning the second signal having the third signal frequency to the second signal frequency in response to a predefined second signal event of the second signal, comprises returning the second signal having the third signal frequency to the second signal frequency in response to a predefined second signal event of the second signal, wherein the second predefined signal event comprises an edge trigger of the second signal.

7. The method according to claim 3, further comprising delivering the output signal as a switching signal for switching between providing a second signal having a second signal frequency or a third signal frequency.

8. The method according to claim 7, wherein delivering a switching signal for switching between providing a second signal having a second signal frequency or a third signal frequency comprises delivering a switching signal based on the first predefined signal event or the second predefined signal event.

9. A method for generating a signal, the method comprising:
providing, by a first signal generator, a first signal having a first signal frequency;
providing, by a second signal generator, a second signal having a second signal frequency or a third signal frequency, wherein the second signal frequency is higher than the third signal frequency;
providing, by a switching circuit, an output signal based on a predefined first signal event of the first signal and a predefined second signal event, for switching the second signal having the second signal frequency to the third signal frequency based on the predefined first signal event and for returning the second signal having the third signal frequency to the second signal frequency based on the predefined second signal event;
wherein providing a first signal having a first signal frequency comprises providing a first signal having a fixed first signal frequency; and
wherein providing a second signal having a second signal frequency or a third signal frequency comprises providing a second signal having a variable frequency comprising a second signal frequency or a third signal frequency.

10. A signal generation circuit, comprising
a first signal generator configured to provide a first signal having a first signal frequency;
a second signal generator configured to provide a second signal having a second signal frequency or a third signal frequency, wherein the second signal frequency is higher than the third signal frequency;
a switching circuit configured to switch the second signal having the second signal frequency to the third signal frequency in response to a predefined first signal event of the first signal, and to switch the second signal having the third signal frequency to the second signal frequency in response to a predefined second signal event;
wherein the first signal having a fixed first signal frequency; and
wherein the second signal having a variable frequency comprising a second signal frequency or a third signal frequency.

11. The signal generation circuit according to claim 10, wherein at least one of the first signal generator and the second signal generator comprises an oscillator circuit.

12. The signal generation circuit according to claim 10, wherein the first signal generator comprises a fixed frequency oscillator circuit.

13. The signal generation circuit according to claim 10, wherein the second signal generator comprises a variable frequency oscillator circuit.

14. The signal generation circuit according to claim 10, wherein the first signal frequency is equal to or smaller than the second signal frequency.

15. The signal generation circuit according to claim 10, wherein the switching circuit comprises a set-reset flip flop circuit having a first input connected to the first signal generator and a second input connected to the second signal generator.

16. The signal generation circuit according to claim 10, wherein the switching circuit is configured to output a generated signal based on the first predefined signal event or the second predefined signal event.

17. The signal generation circuit according to claim 16, wherein the first predefined signal event is dependent on the first signal.

18. The signal generation circuit according to claim 16, wherein the second predefined signal event is dependent on the second signal.

19. The signal generation circuit according to claim 16, wherein the first predefined signal event comprises an edge trigger of the first signal and the second predefined signal event comprises an edge trigger of the second signal.

20. The signal generation circuit according to claim 16, wherein the switching circuit is configured to deliver the generated signal as a switching signal to the second signal generator to switch between providing a second signal having a second signal frequency or a third signal frequency.

21. The signal generation circuit according to claim 10, wherein the switching circuit is configured to deliver a switching signal to the second signal generator based on the first predefined signal event or the second predefined signal event.

22. The signal generation circuit according to claim 10, wherein the switching circuit is configured to deliver a switching signal to the second signal generator such that the second signal generator switches the second signal having the third signal frequency to the second signal frequency in response to an edge trigger of the second signal.

23. The signal generation circuit according to claim 10, wherein the switching circuit is configured to deliver a switching signal to the second signal generator such that the second signal generator switches the second signal having the second signal frequency to the third signal frequency in response to an edge trigger of the first signal.

* * * * *